(12) United States Patent
Smith

(10) Patent No.: US 9,379,098 B2
(45) Date of Patent: Jun. 28, 2016

(54) ELECTROSTATIC DISCHARGE PROTECTION CIRCUIT INCLUDING A DISTRIBUTED DIODE STRING

(75) Inventor: Jeremy Charles Smith, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 217 days.

(21) Appl. No.: 13/563,526

(22) Filed: Jul. 31, 2012

(65) Prior Publication Data
US 2014/0035091 A1 Feb. 6, 2014

(51) Int. Cl.
H01L 27/08 (2006.01)
H01L 27/02 (2006.01)

(52) U.S. Cl.
CPC .................................. H01L 27/0255 (2013.01)

(58) Field of Classification Search
CPC ............ H01L 27/0248; H01L 27/0251; H01L 23/5227; H01L 27/08; H01L 2924/3011; H01L 23/50; H01L 23/60
USPC ......... 257/355, 356, 357, 360, 362, 546, 655, 257/E23.079, 119, 133
See application file for complete search history.

(56) References Cited

U.S. PATENT DOCUMENTS

| | | | |
|---|---|---|---|
| 4,896,243 A | 1/1990 | Chatterjee et al. | |
| 5,530,612 A * | 6/1996 | Maloney | H01L 27/0251 361/118 |
| 5,774,318 A * | 6/1998 | McClure | H01L 27/0259 361/111 |
| 6,060,752 A * | 5/2000 | Williams | H01L 27/0255 257/355 |
| 6,157,530 A | 12/2000 | Pequignot et al. | |
| 6,559,508 B1 | 5/2003 | Lin et al. | |
| 7,078,772 B2 | 7/2006 | Wu et al. | |
| 7,507,001 B2 * | 3/2009 | Kit | F21K 9/17 315/51 |
| 7,715,159 B2 * | 5/2010 | Bazzano | H01L 27/0259 361/111 |
| 7,812,674 B2 | 10/2010 | Carp | |
| 2002/0093022 A1 * | 7/2002 | Otsuka | H01L 27/0814 257/84 |
| 2002/0171984 A1 | 11/2002 | Ratner et al. | |
| 2004/0057172 A1 * | 3/2004 | Sun | H01L 27/0259 361/56 |
| 2005/0083618 A1 | 4/2005 | Steinhoff et al. | |
| 2006/0018063 A1 | 1/2006 | Boezen et al. | |
| 2010/0061027 A1 | 3/2010 | Jiang | |
| 2010/0127782 A1 | 5/2010 | Karp | |

(Continued)

OTHER PUBLICATIONS

Voldman, Steven H., ESD Circuits and Devices, excerpted pages, including Cover page, index pp. vi-xv; and pp. 175-198, Copyright 2006, Published by John Wiley & Sons Ltd., West Sussex, England.

*Primary Examiner* — Stephen W Smoot
*Assistant Examiner* — Edward Chin
(74) *Attorney, Agent, or Firm* — Cesari & Reed LLP; R. Michael Reed

(57) ABSTRACT

An integrated circuit includes first and second terminals. The integrated circuit further includes a first plurality of diodes arranged in series between the first terminal and a power supply terminal and a second plurality of diodes arranged in series between the second terminal and the power supply terminal. The integrated circuit also includes a conductor configured to couple a first node within the first plurality of diodes to a second node within the second plurality of diodes. The first node is located between a first diode of the first plurality of diodes and a last diode of the first plurality of diodes, and the second node is located between a first diode of the second plurality of diodes and a last diode of the second plurality of diodes.

17 Claims, 5 Drawing Sheets

(56) References Cited

U.S. PATENT DOCUMENTS

2010/0214704 A1* 8/2010 Lamey .............. H01L 27/0255
    361/56

2012/0127149 A1* 5/2012 Suzuki .............. G09G 3/3648
    345/212

* cited by examiner

ELECTROSTATIC DISCHARGE PROTECTION CIRCUIT INCLUDING A DISTRIBUTED DIODE STRING

FIELD

The present disclosure is generally related to electrostatic discharge (ESD) protection (ESD) circuits, and more particularly to ESD circuits including diode stacks.

BACKGROUND

Electrostatic discharge (ESD) refers to the phenomenon whereby an electrical current of high magnitude and short duration is discharged at the package terminals of an integrated circuit due to static charge build-up on the integrated circuit (IC) package or on a nearby object, such as a human being or an IC handling machine. Without ESD protection circuitry, an ESD event can damage the IC. Accordingly, circuit designers have developed ESD protection circuitry to discharge ESD currents in a short time in a nondestructive manner A diode string represents one type of ESD circuit that can be used to discharge ESD currents. The diode string is formed in bulk material of a semiconductor substrate by series-connecting P-N junctions typically formed in nwell regions. In particular, each n-well formed in the P-type bulk material is tapped via an n+ diffusion and is connected to the p+ junction of the next diode. The combination of a P+ diffusion contained in an nwell over a P-type substrate forms a parasitic PNP transistor by default, such that the "diode string" is really a chain of PNP transistors. Within the diode string, each PNP transistor has a vertical current gain ($\beta$), which effects the diode string operation, including the total substrate current, the effective on resistance ($R_{on}$), and so on.

As the process technologies advance and the semiconductor technology scales, the vertical current gain ($\beta$) also tends to get smaller due to the n-well retrograde doping profile, in order to fight latch-up. Unfortunately, as the vertical current gain ($\beta$) decreases, the on-resistance ($R_{on}$) of the diode string increases, which can adversely impact the performance of the diode string in response to an ESD event by reducing the amount of current shunted to the substrate. In general, shunting current to the substrate provides an extra current path which contributes to lowering the effective resistance otherwise exhibited by the series connection of diodes.

To accommodate coupling of newer (smaller scale) process circuitry to chips having a higher operating voltage level, some newer circuits include ESD protection circuitry that is designed with a higher turn on voltage. If such ESD protection circuitry includes a diode string, the number of diodes in the string may be increased to set a higher turn-on threshold. However, such diode strings can consume a large amount of circuit real estate.

SUMMARY

In an embodiment, an integrated circuit includes first and second terminals. The integrated circuit further includes a first plurality of diodes arranged in series between the first terminal and a power supply terminal and a second plurality of diodes arranged in series between the second terminal and the power supply terminal. The integrated circuit also includes a conductor configured to couple a first node within the first plurality of diodes to a second node within the second plurality of diodes. The first node is located between a first diode of the first plurality of diodes and a last diode of the first plurality of diodes, and the second node is located between a first diode of the second plurality of diodes and a last diode of the second plurality of diodes.

In another embodiment, an integrated circuit includes a plurality of input/ouput (I/O) pads and a plurality of diodes. At least one of the plurality of diodes is coupled between at least some of the plurality of I/O pads and a node. The integrated circuit further includes a diode string circuit coupled between the node and a power supply node.

In still another embodiment, an integrated circuit a first terminal and a first diode string comprising a first plurality of diodes coupled in series between the first terminal and a power supply terminal. The first diode string includes a first node at a first location between a cathode of a first diode of the first diode string and an anode of a last diode of the first diode string. The integrated circuit further includes a second terminal and a second diode string comprising a second plurality of diodes coupled in series between the second terminal and the power supply terminal. The second diode string includes a second node at a second location between a cathode of a first diode of the second diode string and an anode of a last diode of the second diode string. Additionally, the integrated circuit includes a conductor configured to couple the first node and the second node.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

Embodiments of an ESD protection circuit are described below that include interconnections between diode strings of adjacent input/output (I/O) pads to implement distributed diode strings. Distributing ESD event dissipation through multiple diode strings makes it possible to use tapered diode strings to reduce the cell height of the diode strings without reducing ESD protection. The amount of I/O pad coupling and the diode stage at which the coupling occurs can be programmed In one example, two diode strings can be coupled after the first two diodes in the string, dividing the ESD current between the coupled stages after the first two diodes in the diode string. To better understand some of the advantages, an example of a conventional ESD protection circuit for a high voltage tolerant I/O pad is described below with respect to FIG. 1.

Figure 1:
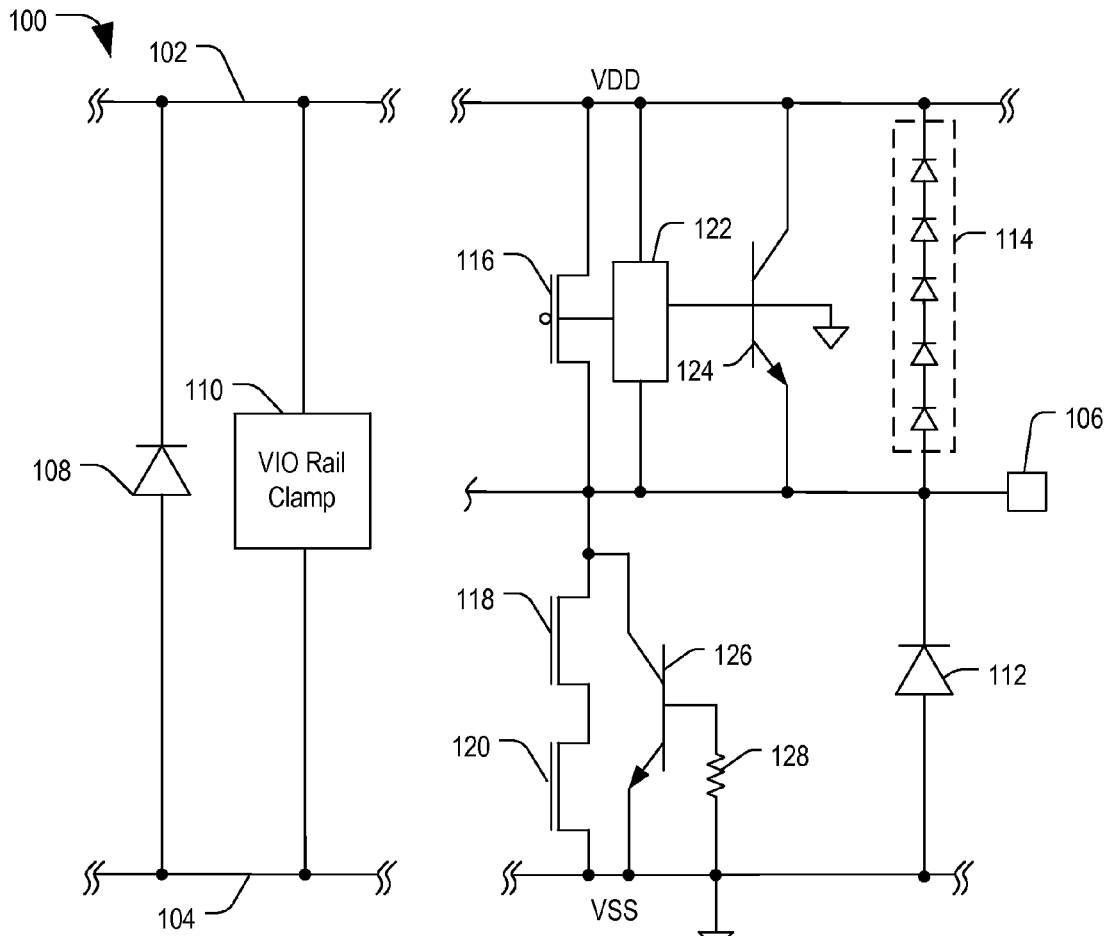
FIG. 1 is a diagram of an embodiment of a conventional high-voltage tolerant I/O buffer and ESD protection circuit including a diode string.

FIG. 1 is a diagram of an embodiment of a circuit 100 including conventional ESD protection circuitry that uses a diode string 114. Circuit 100 includes a first power supply terminal 102, a second power supply terminal 104, and an I/O pad 106. First and second power supply terminals 102 and 104 serve as supply rails for the circuitry. Circuit 100 further includes a diode 108 having an anode coupled to the second power supply terminal 104 and a cathode coupled to the first power supply terminal 102. Circuit 100 also includes a voltage I/O rail clamp 110 configured to clamp a voltage differential between the first and second power supply terminals 102 and 104 to a voltage level that is safe for other associated circuitry.

Circuit 100 includes a p-channel metal oxide semiconductor (PMOS) field effect transistor 116 including a source coupled to first power supply terminal 102, a control terminal, and a drain coupled to I/O pad 106. Block 122 represents an N-well biasing circuit for the PMOS transistor 116 and is coupled to an N-well portion of the gate of PMOS transistor, to the drain and source terminals of PMOS transistor 116, and to a parasitic NPN bipolar junction transistor 126.

Circuit 100 further includes n-channel (NMOS) transistors 118 and 120. NMOS transistor 118 includes a drain coupled to I/O pad 106, a gate, and a source. NMOS transistor 120 includes a drain coupled to the source of NMOS transistor 118 and a source coupled to second power supply terminal 104. NMOS transistors 118 and 120 include a parasitic n-channel bipolar junction transistor 126, which includes a collector coupled to the drain of NMOS transistor 118, a base, and an emitter coupled to second power supply terminal 104. Additionally, a parasitic resistor 128 includes a first terminal coupled to the base of parasitic n-channel bipolar junction transistor 126 and includes a second terminal coupled to second power supply terminal 104.

Circuit 100 includes a diode 112 having an anode terminal coupled to second power supply terminal 104 and a cathode coupled to I/O pad 106. Circuit 100 further includes a diode string 114 having multiple diodes arranged in series. Diode string 114 is depicted as having five diodes arranged in series, but any number of diodes may be included to present a desired turn-on voltage, which is determined by the sum of the built-in potential of each of the diodes in the string. Diode string 114 includes a first diode having an anode terminal coupled to I/O pad 106 and a cathode terminal. A last diode in diode string 114 has an anode terminal coupled to a cathode terminal of a previous diode in diode string 114 and has a cathode terminal coupled to first power supply terminal 102.

In an example, if a voltage is applied to I/O pad 106 that has a negative potential relative to the voltage on second power supply terminal 104, current flows from power supply terminal 104 through diode 112 to I/O pad 106 to mitigate the negative voltage ESD event. In another example, if a voltage is applied to I/O pad 106 that exceeds the turn on voltage of diode string 114, diode string 114 directs current to first supply terminal 102, which increases the voltage potential between first and second supply terminals 102 and 104 until the voltage I/O rail clamp 110 turns on, clamping the voltage to a pre-determined voltage level (that is below a voltage rating of associated circuitry) and shunting excess current to second power supply terminal 104, reducing the voltage potential between first and second supply terminals 102 and 104.

This conventional arrangement allows for a low-voltage circuit to provide ESD dissipation paths for high-voltage tolerant I/O pads, such as I/O pad 106. However, including a diode stack, such as diode stack 114, for each I/O pad consumes a significant portion of the circuit area.

Figure 2:
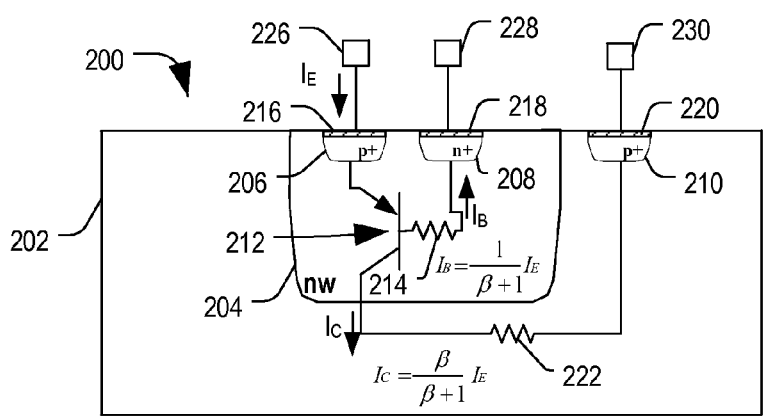
FIG. 2 is a cross-sectional diagram of a portion of a circuit including a semiconductor substrate having p+ and n+ diffused areas and corresponding electrical connections for forming a PNP bipolar junction transistor (BJT).

FIG. 2 is a cross-sectional diagram of a portion of a circuit 200 including a semiconductor substrate 202 having p+ and n+ diffused areas and corresponding electrical connections for forming a PNP BJT 212. Semiconductor substrate 202 is comprised of P-type bulk material including an n-well 204 diffused into the bulk material. Further, a p+ diffusion area 206 is formed in the n-well as is an n+ diffusion area 208. The semiconductor substrate 202 further includes a second p+ diffusion area 210.

A highly conductive region (salicide) 216 is formed on p+ diffusion area 206 for electrically connecting to an emitter terminal 226. Similarly, conductive regions 218 and 220 connect n+ diffusion area 208 and p+ diffusion area 210 to base terminal 228 and collector terminal 230, respectively. A P-N junction connection forms between p+ diffusion area 206 and the n-well 204. The n+ diffusion area 208 forms an ohmic contact to the cathode of the PN junction, including a parasitic resistance 214. Further, a parasitic resistance 222 couples the interior collector region of PNP BJT 212 to the collector terminal 230 through the p-type bulk material of the semiconductor substrate 202.

In active mode, the emitter-base voltage ($V_{EB}$) between the emitter terminal 226 and the base terminal 228 causes the p+ type emitter to be higher in electrical potential than the n+ type base, forward biasing the base-emitter junction. The base current ($I_B$) flowing out from the n+ diffused area 208 to the base terminal 228 is proportional to the emitter current ($I_E$) flowing from the emitter terminal 226 into p+ diffused area 206 as a function of one over the vertical current gain ($\beta$) plus 1 as shown in Equation 1 below.

$$I_B = \frac{1}{\beta+1} I_E \qquad (1)$$

Further, the collector current ($I_C$) is proportional to the emitter current ($I_E$) as a function of the vertical current gain divided by the vertical current gain ($\beta$) plus one according to Equation 2 below:

$$I_C = \frac{\beta}{\beta+1} I_E \qquad (2)$$

In a diode stack or diode string, several BJT devices, such as the PNP BJT 212, are connected such that the n+ diffusion area 208 and associated conductor 218 are coupled to the p+ diffusion area 206 of a next BJT device in the string. In particular, each n-well 204 is tapped and fed to the p+ diffusion area 206 of the next BJT in the string. Any number of P-N junctions can be strung together in this way. Further, the n-wells 204 also form a rectifying junction with the substrate such that the "diode string" represents a chain of PNP connected transistors.

In general, the vertical current gain (β) of the transistors of a diode string strongly determines string characteristics, such as total substrate current, on-resistance, and the like. Additionally, the vertical current gain (β) also varies with both temperature and transistor collector current density.

As discussed above with respect to Equation 2, the collector current ($I_C$) of the transistor 212 is proportional to the emitter current ($I_E$). In a 4-stage (4-diode) diode string and assuming a constant vertical current gain (β), the total substrate current (also total collector current) can be derived through analysis to be given by the following equation:

$$I_{SUB} = I_E\left[\frac{\beta}{\beta+1} + \frac{\beta}{(\beta+1)^2} + \frac{\beta}{(\beta+1)^3} + \frac{\beta}{(\beta+1)^4}\right] \quad (3)$$

As technology scales, (β) tends to reduce in magnitude due to retrograde n-well doping profiles. However, even if the vertical current gain (β) were equal to one for this 4-stage diode string, up to ninety-four percent (½+¼+⅛+1/16) of the injected emitter current flows to the substrate instead of through the diode string.

Similarly, by a related analysis, the on-resistance $R_{ON}$ exhibited by a 4-stage diode string is given by the following equation:

$$R_{ON} = R_D\left[1 + \frac{1}{\beta+1} + \frac{1}{(\beta+1)^2} + \frac{1}{(\beta+1)^3}\right] \quad (4)$$

where $R_D$ is the on-resistance of one diode in the string. As the technology scales and the vertical current gain (β) approaches zero, the on-resistance ($R_{ON}$) of the diode string approaches number of stages times the resistance of each diode (i.e., $4R_D$).

Each stage of the diode string 114 dissipates a portion of the current in response to a ESD event. Conventionally, the first diode in diode string 114 dissipates the largest current, with each diode subsequent diode in diode string 114 dissipating a portion of the remaining current. Due to the value of the vertical current gain (β), each stage or transistor within the "diode string" has less current applied to it because less emitter current flows to each subsequent stage. Thus, the vertical current gain (β) has a substantial impact on the performance of the diode string.

Embodiments of circuits are described below that include interconnected diode strings. The interconnections may connect the diode strings at a selected stage, such as after the first diode, after the second diode, or after some other diode within the diode string, distributing the remaining current across portions of multiple diode strings. By distributing the remaining current across multiple diode strings in parallel, each subsequent diode within the originating string (the diode string coupled to the I/O pad from which the ESD event was received) sinks less current to the substrate, which makes it possible to reduce the size of the subsequent diodes within the diode string. Further, by placing the portions of the diode string in parallel with diodes of other diode strings, the effective on-resistance of the diode string is reduced and the effective vertical current gain (β) is increased, in part, because the current density through each diode is reduced. One example of a circuit including multiple interconnected diode strings is described below with respect to FIG. 3.

Figure 3:
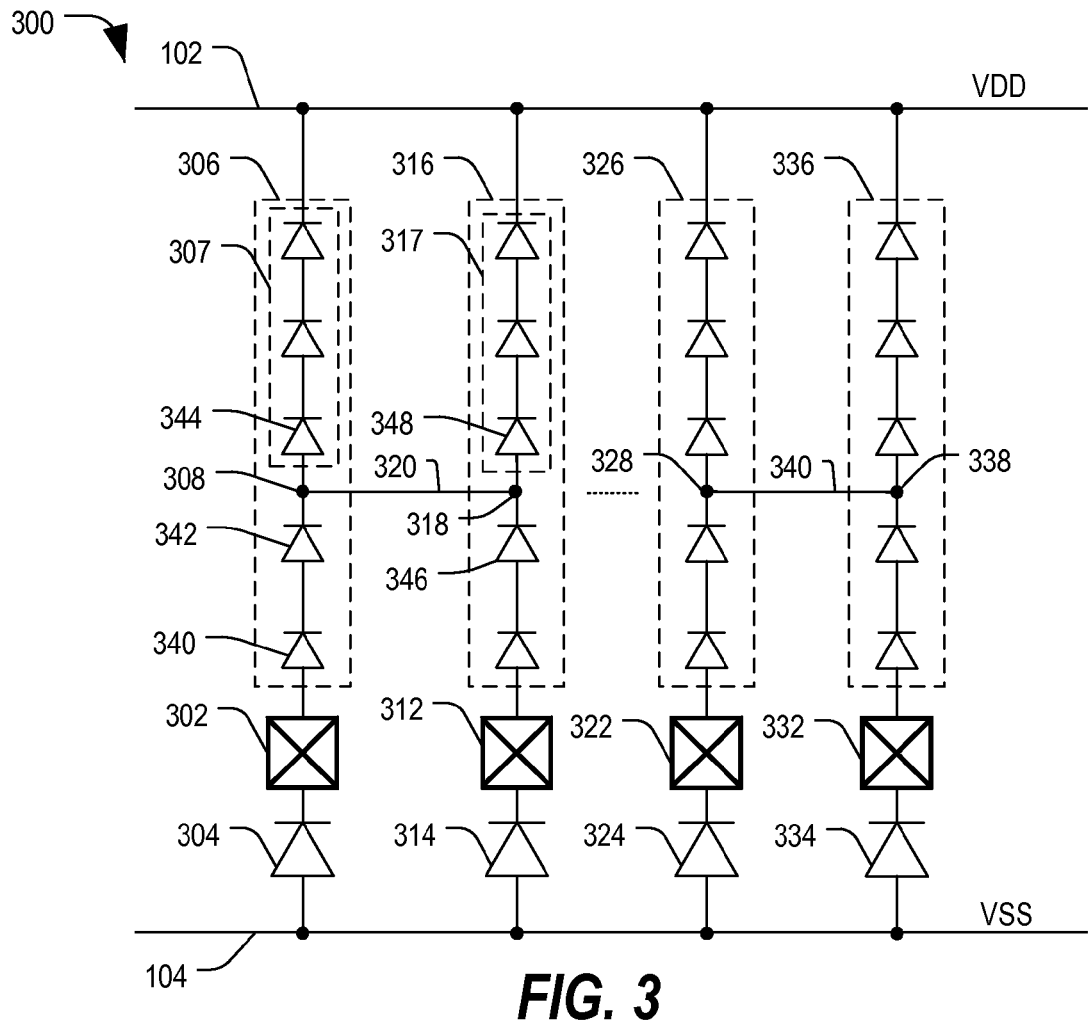
FIG. 3 is a schematic diagram of a portion of an embodiment of a circuit including multiple diode strings interconnected at selected nodes to provide ESD protection.

FIG. 3 is a schematic diagram of a portion of an embodiment of a circuit 300 including multiple diode strings 306, 316, 326, and 336 interconnected at selected nodes to provide ESD protection. Circuit 300 includes first power supply terminal 102 and second power supply terminal 104. Circuit 300 further includes I/O pads 302, 312, 322, and 332 and diodes 304, 314, 324, and 334.

I/O pad 302 is coupled to a cathode of diode 304, which has an anode coupled to second power supply terminal 104. I/O pad 302 is also coupled to an anode terminal of a first diode of diode string 306. Diode string 306 includes multiple diodes connected in series with the cathode of a last diode in diode string 306 coupled to first power supply terminal 102. I/O pad 312 is coupled to a cathode of diode 314, which has an anode coupled to second power supply terminal 104. I/O pad 312 is also coupled to an anode terminal of a first diode of diode string 316. Diode string 316 includes multiple diodes connected in series with the cathode of a last diode in diode string 316 coupled to first power supply terminal 102. I/O pad 322 is coupled to a cathode of diode 324, which has an anode coupled to second power supply terminal 104. I/O pad 322 is also coupled to an anode terminal of a first diode of diode string 326. Diode string 326 includes multiple diodes connected in series with the cathode of a last diode in diode string 326 coupled to first power supply terminal 102. I/O pad 332 is coupled to a cathode of diode 334, which has an anode coupled to second power supply terminal 104. I/O pad 332 is also coupled to an anode terminal of a first diode of diode string 336. Diode string 336 includes multiple diodes connected in series with the cathode of a last diode in diode string 336 coupled to first power supply terminal 102.

Diode string 306 includes a node 308 between the cathode of diode 342 and the anode of diode 344 (i.e., after the second stage of diode string 306). Diode string 316 includes a node 318 between a cathode of diode 346 and an anode of diode 348 (i.e., after the second stage of diode string 316). Nodes 308 and 318 are coupled by a conductor 320. Similarly, a connector 340 couples a node 328 within diode string 326 to a node 338 within diode string 336. In this example, nodes 328 and 338 are located after the second stages of diode strings 326 and 336, respectively; however, in other implementations, nodes 328 and 338 may be at a different stage within their respective diode strings 326 and 336 (such as after the first stage). In some embodiments, each of the diode strings 306, 316, 326, and 336 may be interconnected at a selected stage by a bus, such as an auxiliary ESD bus. In another example, the diode strings 306, 308, 326, and 336 may be interconnected at different stages to steer different amounts of current through the various paths.

In an example, in response to an ESD event or an overvoltage at pad 302, diode string 306 dissipates a first portion of the current through diode 340, a second portion of the current through diode 342, and then distributes the remaining current from node 308 to node 318 and through the remaining, parallel-coupled portions 307 and 317 of diode strings 306 and 316 that are between nodes 308 and 318 and first power supply terminal 102. Any number of diode strings may be interconnected to dissipate excess current. Since the current density decreases through each individual diode and then is further decreased by distributing the current across multiple diode strings, the collector current density is decreased within each of the diodes in the parallel portions 307 and 317 of the diode strings 306 and 316, resulting in a corresponding increase in the vertical current gain (β), which reduces the turn on resistance of the diode string. Thus, the interconnected diode strings can dissipate substantial current in response to an ESD event without having to maintain large diodes for each stack and without increasing the on resistance of the diode string.

In a particular example, the cell height of the diode string was reduced from approximately 75 μm to approximately 57 μm, using ESD bussing to interconnect adjacent diode strings after a second diode in each of the strings. It is possible to interconnect additional stages as well, providing for further cell height reduction. However, in some instances, there may be a tradeoff between circuit area and leakage per pin, which may increase relative to the number of interconnected stages. Further, while the example of FIG. 3 depicts the interconnection at the second stage (i.e., after the second diode in the string), the distribution point or node, such as nodes 308, 318, 328, and 338 can be programmed (moved) for further area reductions.

Figure 4:
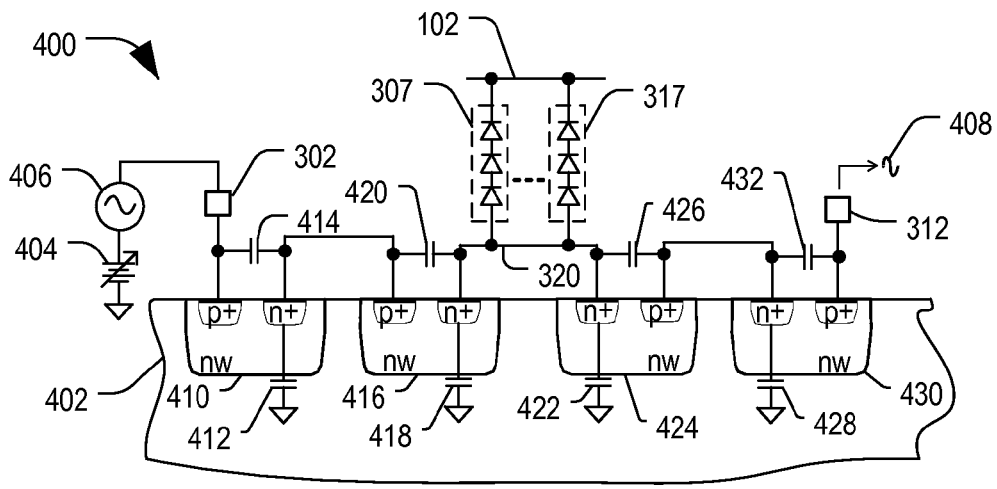
FIG. 4 is a partial schematic and partial cross-sectional view of a model of a portion of the circuit of FIG. 3.

FIG. 4 is a partial schematic and partial cross-sectional view of a model 400 of a portion of the circuit 300 of FIG. 3. Model 400 includes a semiconductor substrate 402 having p+ and n+ diffused areas and corresponding electrical connections for forming PNP BJTs as described above with respect to FIG. 2. Semiconductor substrate 402 is comprised of P-type bulk material including an n-well 410 diffused into the bulk material. Further, a p+ diffusion area is formed in the n-well 410 as is an n+ diffusion area. The semiconductor substrate 402 further includes n-wells 416, 424, and 430 diffused into the bulk material, each of which includes a p+ diffusion area and an n+ diffusion area.

A highly conductive region (such as salicide) may be formed on the p+ diffusion area 206 for electrically connecting to I/O pad 302. Similarly, highly conductive regions may be formed on each of the n+ and p+ diffusion areas for electrical interconnections. As discussed with respect to FIG. 2, P-N junction connections form between each of the p+ diffusion areas and the respective n-wells 410, 416, 424, and 430. The n+ diffusion areas form ohmic contacts to the cathodes of the PN junction, including a parasitic resistance. Further, the n+ diffusion areas are capacitively coupled to the bulk material, which coupling is represented by capacitors 412, 418, 422, and 428.

The p+ diffusion area of n-well 410 is coupled to I/O pad 302 through the highly conductive region and a wire trace. The n+ diffusion area of n-well 410 is coupled to the p+ diffusion area of n-well 416 by a conductive trace, coupling adjacent P-N junction connections to form series-coupled diodes. The n+ diffusion area of n-well 416 is coupled to parallel-coupled portions 307 and 317 of diode strings 306 and 316 in FIG. 3 and to the n+ diffusion area of n-well 424 by a conductor 320. A dashed line is depicted between parallel-coupled portions 307 and 308 to indicate that other diode strings may also be connected in parallel between conductor 320 and first power supply terminal 102 to provide additional current dissipation paths for dissipating ESD events. The p+ diffusion area of n-well 424 is coupled to the n+ diffusion area of n-well 430 through a conductive trace. The p+ diffusion area of n-well 430 is coupled to I/O pad 312 through a highly conductive region and a wire trace.

In the illustrated example, a variable voltage source 404 includes a first electrode coupled to ground and a second electrode coupled to a signal source 406, which is coupled to I/O pad 302. Parasitic capacitances 414, 420, 426, and 432 form between the wire traces that connect to adjacent n+ and p+ diffusion regions. Model 400 represents capacitive coupling from the "aggressor" I/O pad 302 (which receives the source signal) to the "victim" I/O pad 312. If only these parasitic capacitances 414, 420, 426, and 432 were modeled, capacitive coupling would appear to be significant from I/O pad 302 to I/O pad 312 due to the interconnected diode strings. Model 400 includes capacitances 412, 418, 422, and 428 that represent the n-well to substrate capacitance. Each of the capacitances 412, 418, 422 and 428 serves as a shunting element that reduces capacitive coupling.

In a particular example, capacitances 414 and 432 are modeled as 155 femtoFarad (fF) capacitors, and capacitances 420 and 426 are modeled as 124 fF capacitors. Further, capacitances 412 and 428 are modeled as 94 fF capacitors, and capacitances 418 and 422 are modeled as 85 fF capacitors. The size of the capacitors is a function of the circuit fabrication process, and can readily be adjusted by the circuit designer to model the specific circuit implementation.

For digital circuits, such capacitive coupling may not present an issue, in part, because such circuits are not as sensitive to simultaneous switching output (SSO) noise. However, such capacitive coupling may present an issue for "quiet", high-impedance analog I/O pads, in which case, careful consideration should be paid to circuit layout and positioning of the interconnecting node. For example, one technique for reducing capacitive coupling between interconnected I/O pads includes moving the interconnecting node to later stage within the diode string, utilizing the additional capacitances of the P+ N-well and N-well to substrate of junctions of later stages to attenuate the capacitively-coupled signal. Further, the capacitance of the load coupled to I/O pad 312 may partially contribute to the amount of capacitive coupling between I/O pads 302 and 312. However, introduction of additional coupled diode string stages reduces capacitive coupling due to the additional capacitances (that is, capacitor 418 in FIG. 4). In a particular example, by interconnecting 12 diode strings after the second stages, a 10 decibel improvement was achieved in the capacitive coupling relative to interconnection of just 2 diode strings. However, as previously mentioned, increasing the number of interconnected diode strings may adversely impact the leakage per pin.

Simulations were constructed based on model 400 to test coupling gain as a function of frequency while various parameters were adjusted. In FIGS. 5-8, the coupling gain in decibels is described as a function of frequency.

Figure 5:
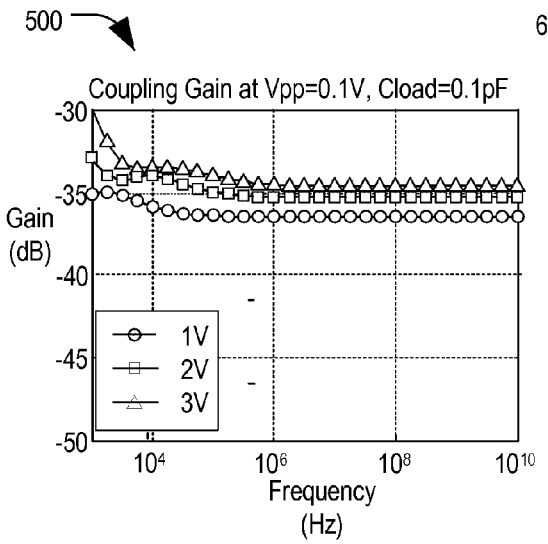
FIGS. 5 and 6 are graphs of capacitive coupling gain versus frequency between input/output terminals of a circuit having diode strings coupled at a second stage and having capacitive loads of 0.1 pF and 1 pF, respectively.
Figure 6:
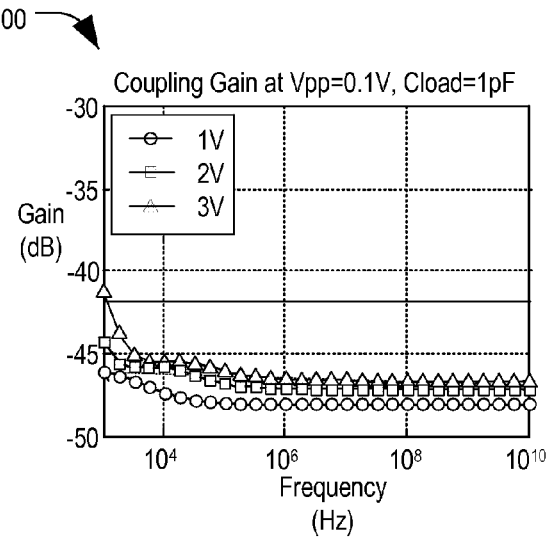

FIGS. 5 and 6 are graphs 500 and 600 of capacitive coupling gain versus frequency between I/O pads of a circuit having two diode strings coupled at a second stage and having capacitive loads at the victim I/O pad of 0.1 pF and 1 pF, respectively. In FIG. 5, a graph 500 of the capacitive coupling gain relative to the input signal frequency is depicted for a circuit having a capacitive load of approximately 0.1 picoFarads (pF) In this example, the peak-to-peak voltage (Vpp) of the input signal (such as from signal source 406 in FIG. 4) is 0.1 volts. When the DC voltage (from variable source 404 in FIG. 4) is 1V, the coupling gain is approximately −35 dB. As the DC voltage increases, the capacitive coupling gain also increases.

In the graph 600 of FIG. 6, the capacitive load is increased from 0.1 pF (in FIGS. 5) to 1 pF. As described above with respect to FIG. 4, the type of load coupled to the "victim" I/O pad impacts the capacitive coupling. In particular, if the capacitance of the load increases, the capacitive coupling gain decreases. In this instance, when the DC voltage is 1 V, the coupling gain decreases from −30 dB to −40 dB (relative to the 0.1 pF load in FIG. 5) at low frequencies and decreases from approximately −35 dB to approximately −47 dB at higher frequencies. Corresponding improvements in coupling gain are also seen at higher DC voltage levels as well.

Figure 7:
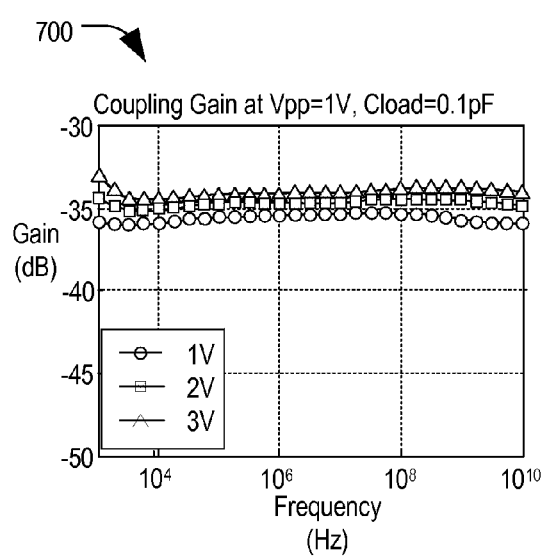
FIGS. 7 and 8 are graphs of capacitive coupling gain versus frequency between input/output terminals of a circuit having diode strings coupled at a second stage and having a higher peak-to-peak voltage relative to the graphs of FIGS. 5 and 6.
Figure 8:
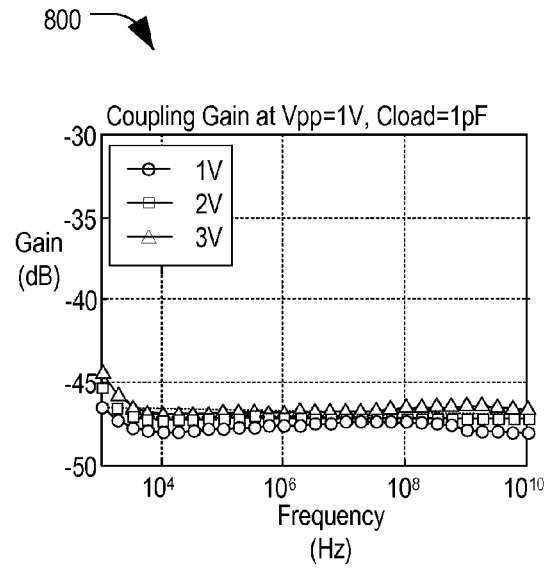

FIGS. 7 and 8 are graphs 700 and 800 of capacitive coupling gain versus frequency between I/O pads of a circuit having diode strings coupled at a second stage and having higher peak-to-peak voltages from an input source relative to the graphs of FIGS. 5 and 6. Again, referring to model 400 in FIG. 4, signal source 406 supplies a time-varying signal having a peak-to-peak voltage (Vpp) of 1 volt, a capacitive load coupled to I/O pad 312, and a variable DC voltage from voltage source 404. In FIG. 7, the capacitive load is 0.1 pF. As compared to graph 500 in FIG. 5, the capacitive coupling gain decreased slightly with the higher Vpp from signal source 406. In FIG. 8, the capacitive load is increased to 1 pF, and again, the capacitive coupling gain decreased slightly as compared to the lower Vpp from signal source 406 in FIG. 6.

In each of the above-examples, the coupling stage has been the second stage of the diode string. If the coupling stage is changed from the second to the third stage, the capacitive coupling between the "aggressor" and "victim" I/O pads decreases. Using model 400, at 0.1 Vpp for the signal source and with a 0.1 pF capacitive load and a 1V DC input voltage, the capacitive coupling gain decreases to approximately −53 dB at a frequency 1000 Hz (approximately a 18 dB improvement as compared to the second stage configurations of FIGS. 5 and 7). When the capacitive load is increased to 1 pF, the capacitive coupling gain decreases to between −60 and −65 dB, as compared to the −46 dB in FIGS. 6 and 8. Accordingly, a capacitive coupling gain improvement can be achieved by adjusting the coupling stage.

In another example where the coupling stage is changed to the 4$^{th}$ stage, at 0.1 Vpp for the signal source and with a 0.1 pF capacitive load and a 1V DC input voltage, the capacitive coupling gain decreases to approximately −62 dB at a frequency 1000 Hz (approximately a 29 dB improvement as compared to the second stage configurations of FIGS. 5 and 7). When the capacitive load is increased to 1 pF, the capacitive coupling gain decreases to between −81 to 82 dB, as compared to the −46 dB in FIGS. 6 and 8 (approximately a 35 dB improvement). Accordingly, a capacitive coupling gain improvement can be achieved by adjusting the coupling stage.

As previously discussed with respect to FIG. 4, it is also possible to decrease the capacitive coupling gain by including more shared or coupled diode strings. One possible implementation that includes a bus that couples multiple diode strings at their respective second stages is described below with respect to FIG. 9.

Figure 9:
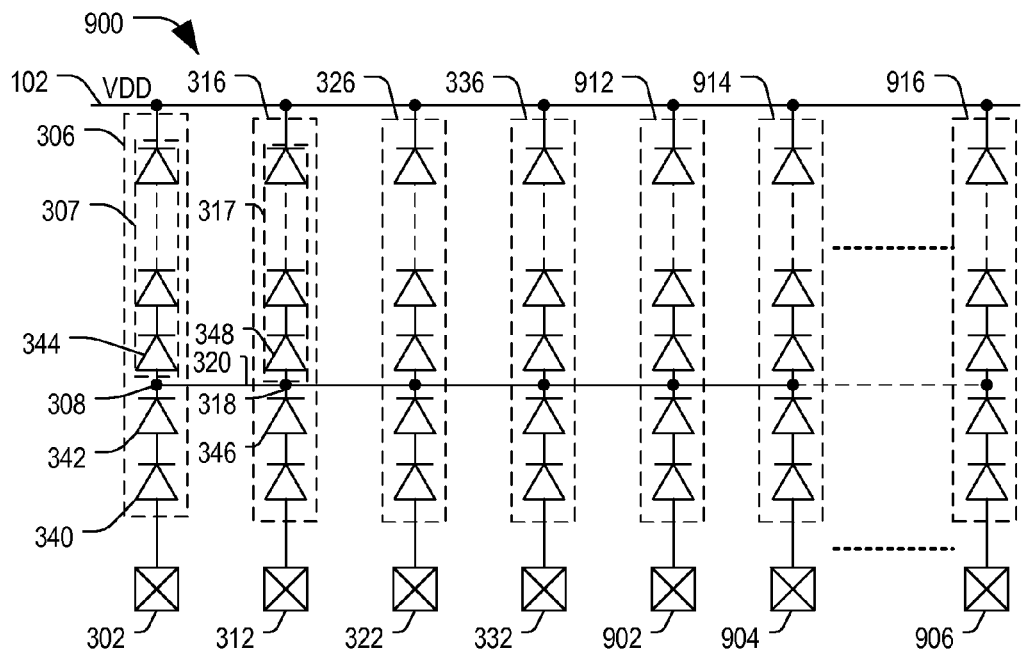
FIG. 9 is a schematic diagram of a portion of a second embodiment of a circuit including multiple diode strings interconnected at their respective second stages to provide ESD protection.

FIG. 9 is a schematic diagram of a portion of a second embodiment of a circuit 900 including multiple diode strings 306, 316, 326, 336, 912, 914, and 916 interconnected at their respective second stages to provide ESD protection. Circuit 900 includes I/O pads 302, 312, 322, 332, 902, 904, and 906, which are coupled to first power supply terminal 102 through diode strings 306, 316, 326, 336, 912, 914, and 916, respectively. Diode string 306 includes diode 340 having an anode coupled to I/O pad 302 and a cathode coupled to an anode of diode 342, which has a cathode coupled to node 308. Node 308 is coupled to node 318 of diode string 316 and to corresponding nodes of second stages of diode strings 326, 336, 912, 914, and 916. A dashed line is depicted between diode strings 914 and 916 to indicate that any number of diode strings may be interconnected to form the ESD protection circuitry.

In response to an ESD event at I/O pad 902 that exceeds the turn on voltage for diode string 914, current is conducted through diode string 912. Once the current reaches conductor 320, conductor 320 distributes the current to the second stages of the other diode strings 306, 316, 326, 336, 914, and 916 where it is dissipated through the parallel coupled portions (such as portions 307 and 317 of diode strings 306 and 316) of the diode strings to dissipate the ESD current.

While the example of FIG. 9 depicts multiple diode strings interconnected by a common conductor 320 at a second stage of each of the diode strings, it is also possible to provide distributed ESD protection using a single shared diode string. One example of such a circuit is described below with respect to FIG. 10.

Figure 10:
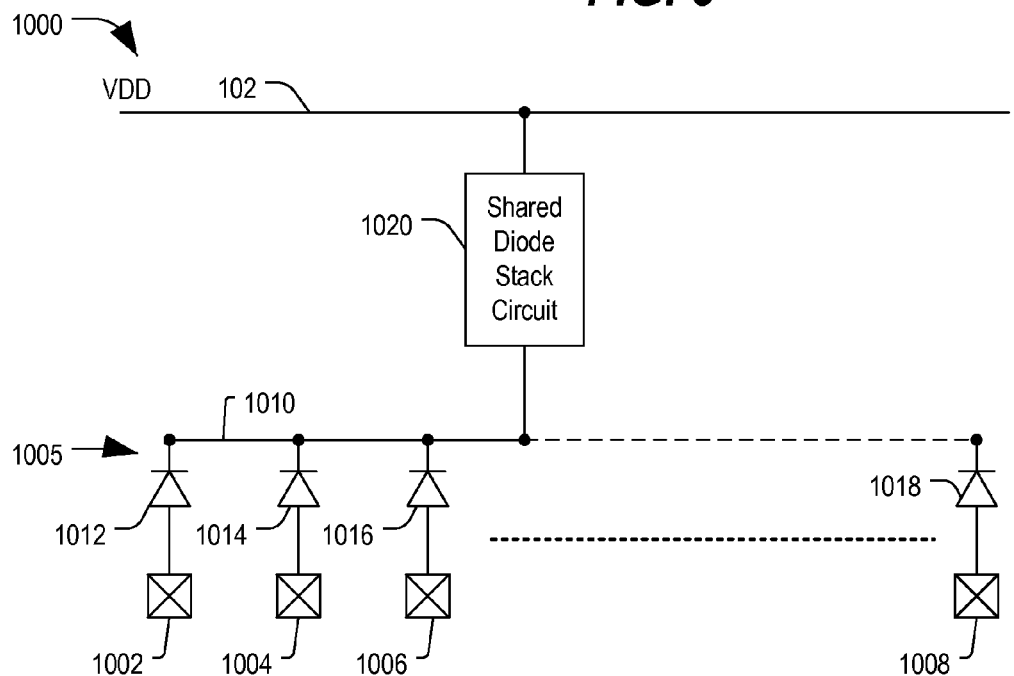
FIG. 10 is a diagram of a portion of a third embodiment of a circuit including multiple I/O pads coupled to a shared diode string circuit configured to provide ESD protection.

FIG. 10 is a diagram of a portion of a third embodiment of a circuit 1000 including multiple I/O pads 1002, 1004, 1006, and 1008 coupled to a shared diode string circuit 1020 configured to provide ESD protection. Circuit 1000 includes a power supply terminal (VDD) 102 or common node. Additionally, circuit 1000 includes a plurality of diodes 1012, 1014, 1016, and 1018. Diode 1012 includes an anode coupled to pad 1002 and a cathode coupled to a node 1010. Diode 1014 includes an anode coupled to pad 1004 and a cathode coupled to node 1010. Diode 1016 includes an anode coupled to pad 1006 and a cathode coupled to node 1010. Diode 1018 includes an anode coupled to pad 1008 and a cathode coupled to node 1010. Shared diode string circuit 1020 includes a first terminal coupled to node 1010 and a second terminal coupled to power supply terminal 102.

In an example, a transient at any of I/O pads 1002, 1004, 1006, and 1008 passes through the associated diode 1012, 1014, 1016, or 1018 and is delivered to the shared diode stack circuit 1020 through node 1010. In an example, node 1010 may be a terminal, node, or bus that interconnects each of the I/O pads 1002, 1004, 1006, and 1008 to shared diode stack circuit 1020. In this example, each I/O pad 1002, 1004, 1006, and 1008 includes a first diode stage 1005 that prevents current from flowing from node 1010 to the I/O pads.

Shared diode stack circuit 1020 includes one or more diode strings coupled between node 1010 and power supply terminal (or node) 102. If more than one diode string is present, the diode strings can be connected in parallel between node 1010 and node 102 to distribute the ESD current. In general, any number of diode stacks or strings may be included within distributed diode stack circuit 1020.

Interconnecting the diode strings makes it possible to utilize smaller diodes that might otherwise be needed to dissipate the ESD current. In particular, the diode strings may be tapered, with each diode being smaller than the previous diode in the string. The parallel-coupled diodes may be made even smaller than would otherwise be possible, since the current density would be distributed across the parallel portions of the diode strings. Further, by coupling each of the I/O pads to a common node that is coupled to a diode stack circuit 1020, the circuit layout can be simplified and the circuit area can be reduced as well. One example of a circuit that includes tapered diode strings is described below with respect to FIG. 11.

Figure 11:
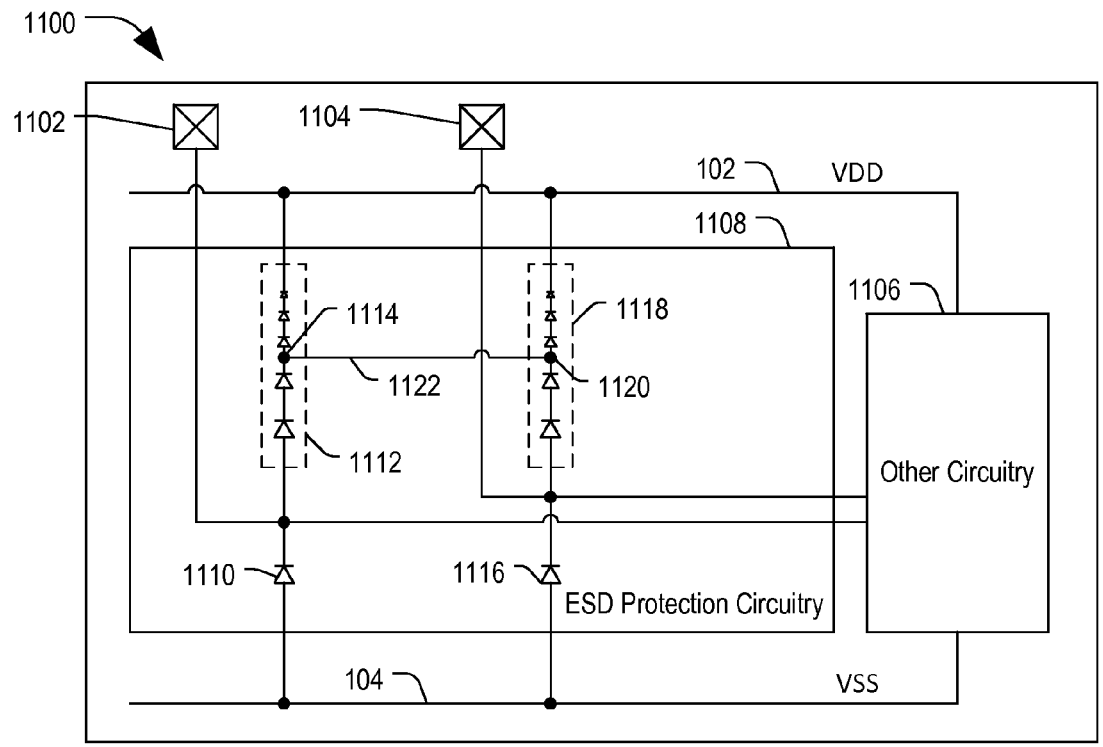
FIG. 11 is an illustrative example of a circuit including ESD protection circuitry having interconnected, tapered diode strings

FIG. 11 is an illustrative example of a circuit 1100 including ESD protection circuitry 1108 having interconnected, tapered diode strings 1112 and 1118. Circuit 1100 includes I/O pads 1102 and 1104, which are coupled to other circuitry 1106 through ESD protection circuitry 1108. Other circuitry 1106 is coupled to first supply terminal 102 and second supply terminal 104.

ESD protection circuitry 1108 includes a diode 1110 including an anode coupled to second supply terminal 104 and a cathode coupled to I/O pad 1102. ESD protection circuitry 1108 further includes a tapered diode string 1112 having a plurality of diodes connected in series between I/O pad 1102 and first supply terminal 102. Within the tapered diode string 1112, the diodes become smaller at each subsequent stage moving from I/O pad 1102 to first supply terminal 102.

ESD protection circuitry further includes a diode 1116 including an anode coupled to second supply terminal 104 and a cathode coupled to I/O pad 1104. ESD protection circuitry 1108 also includes a tapered diode string 1118 having a plurality of diodes connected in series between I/O pad 1104 and first supply terminal 102. Within the tapered diode string 1118, the diodes become smaller at each subsequent stage moving from I/O pad 1104 to first supply terminal 102.

Tapered diode string 1112 has a node 1114 at a second stage that is coupled to a corresponding node 1120 at a second stage of tapered diode string 1118 by a conductor 1122. Conductor 1122 distributes current from an ESD event between tapered diode strings 1112 and 1118, dissipating the ESD current through both current paths and effectively reducing the current density through the smaller diodes of diode strings 1112 and 1118.

By interconnecting the diode strings, ESD protection is distributed across the shared portions of the diode strings, reducing the current density at any one of the diodes of the shared portions as compared to the same diode if the diode strings were not connected. This makes it possible to reduce the size of the individual diodes and to reduce the overall size of the ESD protection circuitry without sacrificing ESD protection.

While the above-examples have described embodiments of the circuit, other implementations are also possible where the ESD protection circuitry is interconnected to share diode strings. Such interconnections can be programmed during fabrication to produce the ESD protection circuit. One possible example of a method of producing shared diode strings is described below with respect to FIG. 12.

Figure 12:
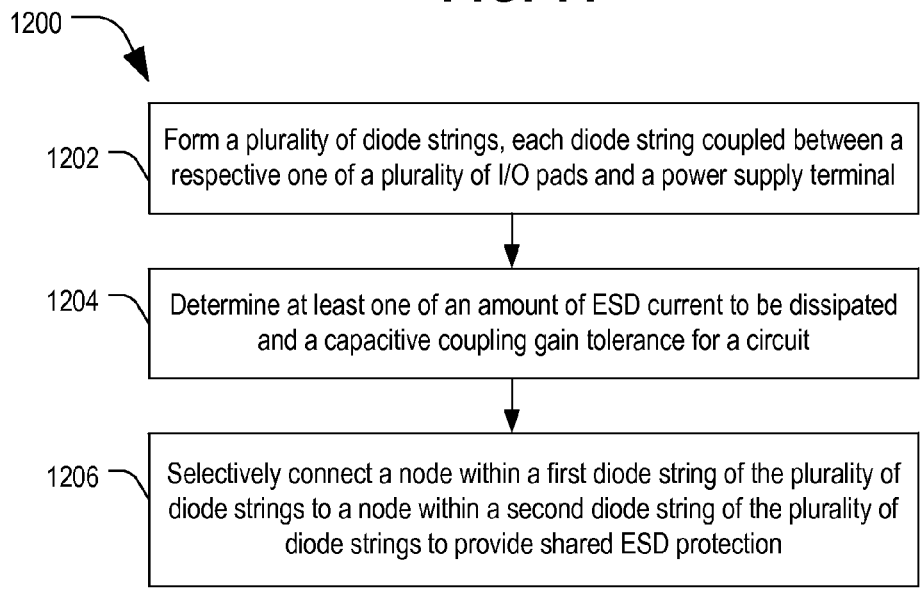
FIG. 12 is a flow diagram of an embodiment of a method of providing ESD protection using multiple interconnected diode strings.

FIG. 12 is a flow diagram of an embodiment of a method 1200 of providing ESD protection using multiple interconnected diode strings. At 1202, a plurality of diode strings is formed, where each diode string is coupled to a respective one of a plurality of I/O pads and a power supply terminal. Advancing to 1204, at least one of an amount of ESD current to be dissipated and a capacitive coupling gain tolerance for a circuit are determined The determination can be used to identify the stage at which the diode strings should be interconnected to provide ESD protection. Continuing to 1206, a node within a first diode string of the plurality of diode strings is selectively connected to a node within a second diode string of the plurality of diode strings to provide shared ESD protection.

In conjunction with the circuits and methods described above with respect to FIGS. 1-12, an ESD protection circuit is described that includes diode strings coupled to I/O pads, where the ESD protection circuits are interconnected at a selected stage in order to distribute ESD current between parallel portions of the diode strings. The interconnection distributes the ESD current through multiple current paths, reducing current density and distributing ESD protection. Further, ESD protection circuitry may be formed from tapered diode strings having smaller diodes than conventional ESD protection circuits, making it possible to reduce the size of the ESD protection circuitry.

Although the present invention has been described with reference to preferred embodiments, workers skilled in the art will recognize that changes may be made in form and detail without departing from the scope of the invention.

What is claimed is:

1. An integrated circuit comprising:
   a first input/output (I/O) pad;
   a second I/O pad;
   a first plurality of diodes arranged in series between the first I/O pad and a power supply terminal;
   a second plurality of diodes arranged in series between the second I/O pad and the power supply terminal;
   a conductor configured to couple a first node within the first plurality of diodes to a second node within the second plurality of diodes such that the first plurality of diodes is electrically coupled to the second plurality of diodes only between the first node and the second node, the first node is located between a first diode of the first plurality of diodes and a last diode of the first plurality of diodes, the second node is located between a first diode of the second plurality of diodes and a last diode of the second plurality of diodes; and
   wherein at least one of the first plurality of diodes and the second plurality of diodes comprises a tapered diode string arranged in series and having decreasing diode sizes along a length of the tapered diode string.

2. The integrated circuit of claim 1, wherein at least one of the first I/O pad and the second I/O pad comprises an input/output (I/O) bond pad.

3. The integrated circuit of claim 1, wherein a location of the first node and the second node within the first and second pluralities of diodes is programmed to provide a selected amount of charge dissipation.

4. The integrated circuit of claim 3, wherein:
   the first node corresponds to a cathode of a second diode coupled to the first diode in the first plurality of diodes; and
   the second node corresponds to a cathode of a second diode coupled to the first diode in the second plurality of diodes.

5. The integrated circuit of claim 1, wherein the conductor distributes an electrostatic discharge (ESD) charge between the first and second pluralities of diodes.

6. The integrated circuit of claim 1, further comprising:
   a third I/O pad;
   a third plurality of diodes arranged in series, the third plurality of diodes including an anode coupled to the third I/O pad and including a cathode coupled to a power supply; and
   a second conductor configured to couple a third node of the third plurality of diodes to the second node of the second plurality of diodes.

7. An integrated circuit comprising:
   a plurality of input/output (I/O) pads including a first I/O pad and a second I/O pad;
   a plurality of diodes including:
      at least one first diode coupled between the first I/O pad and a node;
      at least one second diode coupled between the second I/O pad and the node; and
   a diode string circuit coupled between the node and a power supply node, the diode string circuit comprising a second plurality of diodes arranged in series and having decreasing diode sizes along a length of the series, the diode string circuit shared by at least some of the plurality of I/O pads to provide an electrostatic discharge from one of the first I/O pad and the second I/O pad to the power supply node.

8. The integrated circuit of claim 7, wherein the diode string circuit includes a plurality of diode strings coupled in parallel with the second plurality of diodes between the node and the power supply node.

9. The integrated circuit of claim 8, wherein the plurality of diode strings operate to dissipate a portion of an electrostatic discharge (ESD) charge that is provided to the node.

10. The integrated circuit of claim 8, wherein at least one of the plurality of diode strings comprises a tapered diode string.

11. The integrated circuit of claim 8, wherein:
  at least some of the respective plurality of diode strings include a first diode having first dimensions and at least one second diode having second dimensions; and
  the first dimensions are greater than the second dimensions.

12. The integrated circuit of claim 7, wherein the at least one of the plurality of diodes comprises:
  a first diode including an anode coupled to one of the plurality of I/O pads and including a cathode; and
  a second diode including an anode coupled to the cathode terminal of the first diode and including a cathode coupled to the node.

13. An integrated circuit comprising:
  a first input/output (I/O) pad;
  a first diode string comprising a first plurality of diodes coupled in series between the first I/O pad and a power supply, the first diode string including a first node at a first location between a cathode of a first diode of the first diode string and an anode of a last diode of the first diode string;
  a second I/O pad;
  a second diode string comprising a second plurality of diodes coupled in series between the second I/O pad and the power supply, the second diode string including a second node at a second location between a cathode of a first diode of the second diode string and an anode of a last diode of the second diode string;
  a conductor configured to couple the first node and the second node such that the first diode string is electrically coupled to the second diode string only between the first node and the second node; and
  wherein at least one of the first plurality of diodes and the second plurality of diodes comprises a tapered diode string having decreasing sizes along a length of the tapered diode string.

14. The integrated circuit of claim 13, wherein a first location of the first node and a second location of the second node is programmed to provide a selected amount of charge dissipation through the first and second diode strings, respectively.

15. The integrated circuit of claim 14, wherein:
  the first node corresponds to a cathode of a second diode coupled to the first diode in the first plurality of diodes; and
  the second node corresponds to cathode of a second diode coupled to the first diode in the second plurality of diodes.

16. The integrated circuit of claim 13, wherein the conductor distributes an electrostatic discharge (ESD) charge between the first and second pluralities of diodes.

17. The integrated circuit of claim 13, further comprising:
  a third I/O pad;
  a third diode string comprising a third plurality of diodes coupled in series between the third I/O pad and the power supply, the third diode string including a third node at a third location between a cathode of a first diode of the third diode string and an anode of a last diode of the third diode string; and
  a second conductor configured to couple the third node of the third plurality of diodes to the second node of the second plurality of diodes.

\* \* \* \* \*